(12) United States Patent
Wang et al.

(10) Patent No.: US 11,622,480 B2
(45) Date of Patent: Apr. 4, 2023

(54) DISPLAY HAVING AN EVAPORATOR

(71) Applicant: DYNASCAN TECHNOLOGY CORP., Taoyuan (TW)

(72) Inventors: Tsun-I Wang, Taoyuan (TW); Ching-Chun Wu, Taoyuan (TW); Jianhung Lin, Taoyuan (TW); Shao En Chung, Taoyuan (TW)

(73) Assignee: DYNASCAN TECHNOLOGY CORP., Taoyuan (TW)

( * ) Notice: Subject to any disclaimer, the term of this patent is extended or adjusted under 35 U.S.C. 154(b) by 107 days.

(21) Appl. No.: 17/205,427

(22) Filed: Mar. 18, 2021

(65) Prior Publication Data
US 2022/0304188 A1 Sep. 22, 2022

(51) Int. Cl.
*H05K 7/20* (2006.01)
*G02F 1/1333* (2006.01)

(52) U.S. Cl.
CPC ..... *H05K 7/2099* (2013.01); *G02F 1/133385* (2013.01); *H05K 7/20136* (2013.01); *H05K 7/20309* (2013.01); *G02F 1/13332* (2021.01)

(58) Field of Classification Search
None
See application file for complete search history.

(56) References Cited

U.S. PATENT DOCUMENTS

2003/0205363 A1  11/2003  Chu
2022/0236015 A1*  7/2022  Wei .................... F28F 1/325

FOREIGN PATENT DOCUMENTS

| CN | 101207112 A | 6/2008 |
|---|---|---|
| CN | 101566748 A | 10/2009 |
| CN | 102749741 A | 10/2012 |
| CN | 103591568 A | 2/2014 |
| CN | 206020860 U | 3/2017 |
| CN | 208444109 U | 1/2019 |
| CN | 109599375 A | 4/2019 |
| CN | 110687717 A | 1/2020 |

OTHER PUBLICATIONS

International Search Report and Written Opinion in International Patent Application No. PCT/CN2021/118492, dated Dec. 16, 2021, in 10 pages.

* cited by examiner

*Primary Examiner* — Richard H Kim
(74) *Attorney, Agent, or Firm* — Duane Morris LLP (57) ABSTRACT

The present disclosure provides a display. The display includes a display module, a supporting plate, and an evaporator. The display module has a front surface and a rear surface opposite the front surface of the display module. The supporting plate is attached to the rear surface of the display module. The evaporator is attached to the supporting plate and thermally connected to the rear surface of the display module through the supporting plate.

25 Claims, 9 Drawing Sheets

DISPLAY HAVING AN EVAPORATOR

BACKGROUND

1. Technical Field

The present disclosure generally relates to a display having an evaporator.

2. Description of the Related Art

A cooling system may be used in a display apparatus to prevent the interior of the display apparatus from overheating. Conventionally, a cooling system may include an evaporator for cooling the air and a fan for circulating the cooled air. Such a cooling system may be bulky and the heat dissipation effectiveness may need to be improved.

SUMMARY

In one or more embodiments, the present disclosure provides a display. The display includes a display module, a supporting plate, and an evaporator. The display module has a front surface and a rear surface opposite the front surface of the display module. The supporting plate is attached to the rear surface of the display module. The evaporator is attached to the supporting plate and thermally connected to the rear surface of the display module through the supporting plate.

In one or more embodiments, the present disclosure provides a display. The display includes a display module and a one-piece supporting structure. The display module has a front surface and a rear surface opposite the front surface of the display module. The one-piece supporting structure includes a first fluid-guiding part and a plate portion and is disposed on the rear surface of the display module. The display further includes a first evaporator disposed on the plate portion and next to the first fluid-guiding part. The first fluid-guiding part is in fluid communication with the first evaporator.

In one or more embodiments, the present disclosure provides a display. The display includes a display module, a fluid-guiding part, and an evaporator. The display module has a front surface and a rear surface opposite the front surface of the display module. The fluid-guiding part is disposed on and thermally connected to the rear surface of the display module. The fluid-guiding part defines a part of a first fluid path extending across the rear surface of the display module. The evaporator is disposed on the rear surface of the display module and next to the fluid-guiding part. The evaporator defines a second fluid path for conducting a phase change material. The second fluid path is isolated from the first fluid path.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. The present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1A:
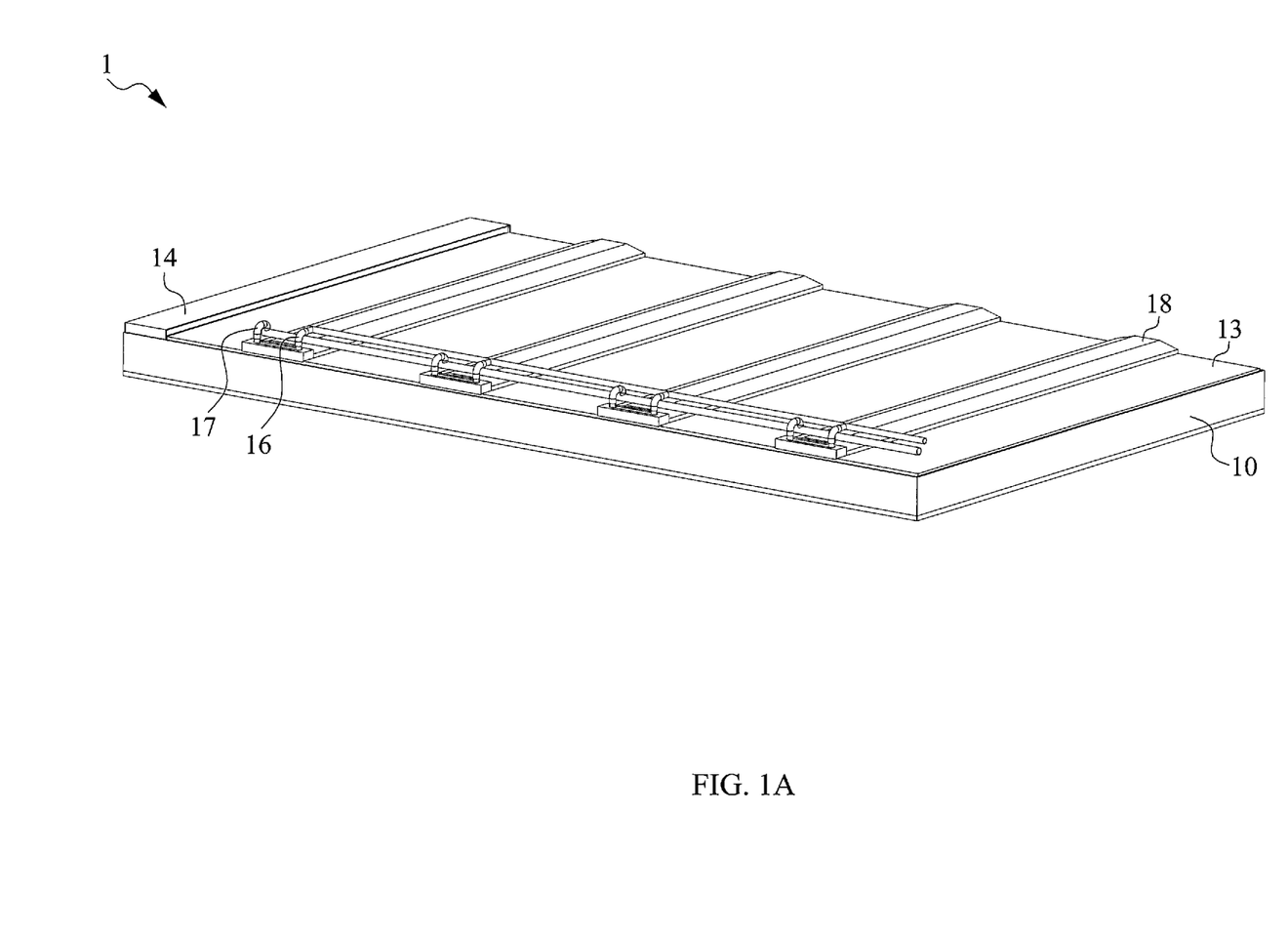
FIG. 1A is a perspective view of an exemplary display, in accordance with an embodiment of the present disclosure.
Figure 1B:
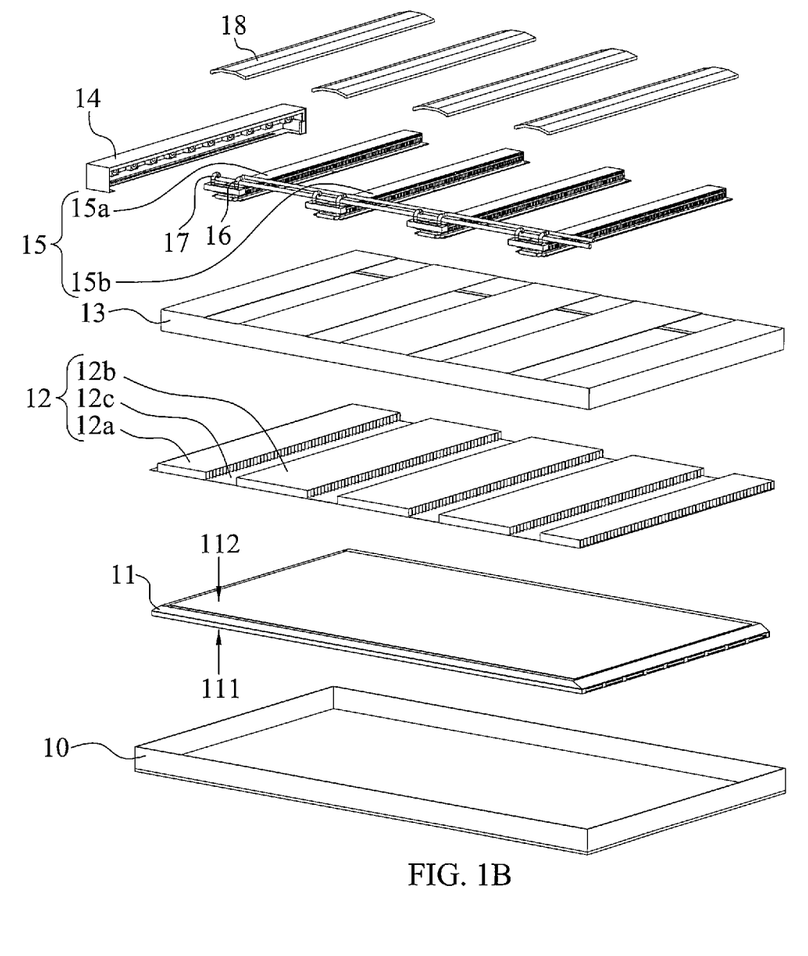
FIG. 1B is an exploded view of the exemplary display in FIG. 1A, in accordance with an embodiment of the present disclosure.

FIG. 1A is a perspective view of an exemplary display 1, in accordance with an embodiment of the present disclosure. FIG. 1B is an exploded view of the exemplary display 1 in FIG. 1A, in accordance with an embodiment of the present disclosure. In some arrangements, the display 1 includes a housing 10, a display module 11, a supporting structure 12, a frame 13, a fan module 14, evaporators 15a and 15b (collectively referred to as the evaporator 15), tubes 16, 17, and caps 18.

The housing 10 may have a front plate (such as a transparent front plate) and sidewalls. The display module 11 may be received in a space or a room defined by the housing 10. The display module 11 may have a front surface 111 and a rear surface 112 opposite the front surface 111. In some embodiments, the display module 11 may include, for example but not limited thereto, a liquid crystal display (LCD), a light emitting diode (LED), or an organic light emitting device (OLED). In some embodiments, the display module 11 may include a backlight layer, a transparent layer (such as a glass panel, a liquid crystal panel, or a plastic panel), a diffuser, a polarizer, a filter, a light guiding element, a lens, or other optical elements. In some embodiments, the backlight layer may include a plurality of light emitting pixels (such as the pixels 11a illustrated in FIG. 1C). In some embodiments, the light emitting pixels may emit light toward the front surface 111 and the front plate of the housing 10.

The supporting structure 12 may be disposed on the rear surface 112 of the display module 11, received in the space defined by the housing 10, and covered by the frame 13. The supporting structure 12 has a supporting plate 12c and a plurality of fluid guiding parts (including the fluid guiding parts 12a and 12b) supported by the supporting plate 12c.

The supporting plate 12c may be attached to the rear surface 112 of the display module 11. The supporting plate 12c may be in contact with the rear surface 112 of the display module 11. When integrated, the evaporator 15 and the fluid guiding parts may be supported by the supporting plate 12c. For example, the evaporator 15 and the fluid guiding parts may be attached to the rear surface 112 of the display module 11 through the supporting plate 12c.

The number of the fluid guiding parts 12a and 12b may be determined based on the size of the module 11 or other design requirements and is not limited to this embodiment. The fluid guiding parts may be spaced apart from each other. For example, the fluid guiding parts 12a and 12b may be spaced by a distance in order to accommodate the evaporator 15a.

In some embodiments, the fluid guiding parts may include an aluminum extrusion (such as an aluminum t-slot extrusion). In some embodiments, the fluid guiding parts may include a plurality of channels or cells. For example, as shown in FIG. 1B, the cross-sectional view of the fluid guiding parts may include a plurality of combined openings.

In some embodiments, the fluid guiding parts may provide mechanical strength for supporting the display module 11. In some embodiments, the fluid guiding parts may serve as a pipe or passage for air or wind from the fan module 14 to go through. In some embodiments, the channels of the fluid guiding part 12a and the channels of the fluid guiding part 12b may have the same dimension (e.g., the width, the height, and/or the length). In some embodiments, the channels of the fluid guiding part 12a and the channels of the fluid guiding part 12b may have a different dimension. In some embodiments, the channels of the fluid guiding part 12a and the channels of the fluid guiding part 12b may have other structures or arrangements, and are not limited to the specific structures or arrangements in FIG. 1B.

The frame 13 may be disposed on the supporting structure 12. The fluid guiding parts may be covered by the frame 13. The supporting plate 12c may be fully or partially exposed from the frame 13.

The fan module 14 may be received in the housing 10 and disposed next to the supporting structure 12 so as to be in fluid communication with the fluid guiding parts and the evaporators 15.

In some embodiments, the evaporator 15 may be disposed on the supporting plate 12c (which is exposed through the frame 13), received in the space defined by the housing 10, and covered by the cap 18.

The evaporator 15 may be disposed on the supporting plate 12c. The evaporator 15 may be in contact with the supporting plate 12c. The evaporator 15 may be in thermal conduction with the supporting plate 12c. A portion of the supporting plate 12c may between the evaporator 15 and the rear surface 112 of the display module 11. For example, the evaporator 15 may be in thermal conduction with the rear surface 112 of the display module 11. For example, the evaporator 15 may be thermally connected with the rear surface 112 of the display module 11.

Each of the evaporators 15 and each of the fluid guiding parts may be disposed alternately. For example, the evaporator 15a may be disposed between the fluid guiding part 12a and the fluid guiding part 12b. The evaporator 15a may be in fluid communication with the fluid guiding part 12a and the fluid guiding part 12b. The air coming from the fluid guiding part 12a to the fluid guiding part 12b may pass through the evaporator 15a.

The tubes 16 and 17 may be in fluid communication with each of the evaporators 15. In some embodiments, the tubes 16 and 17 may be configured to conduct a phase change material to each of the evaporators 15. For example, the air coming from the fluid guiding part 12a may be cooled by the evaporator 15a. In some embodiments, the tubes 16 and 17 may be in fluid communication with a source (not illustrated in the figures) of a phase change material, a refrigerated air, a coolant agent, or a freezing mixture.

In some embodiments, the phase change material may include a saturation temperature between about 30° C. and about 50° C. In some embodiments, the phase change material may include, for example but not limited thereto, R-134a, R290, R1234yf, or R1234ze.

In some embodiments, the housing 10, the frame 13, the fan module 14, and the cap 17 may form a sealed space. For example, the air generated by the fan module 14 may be isolated from the environment. In some embodiments, the tubes 16 and 17 may be fully or partially exposed from the sealed space after integrated.

Figure 1C:
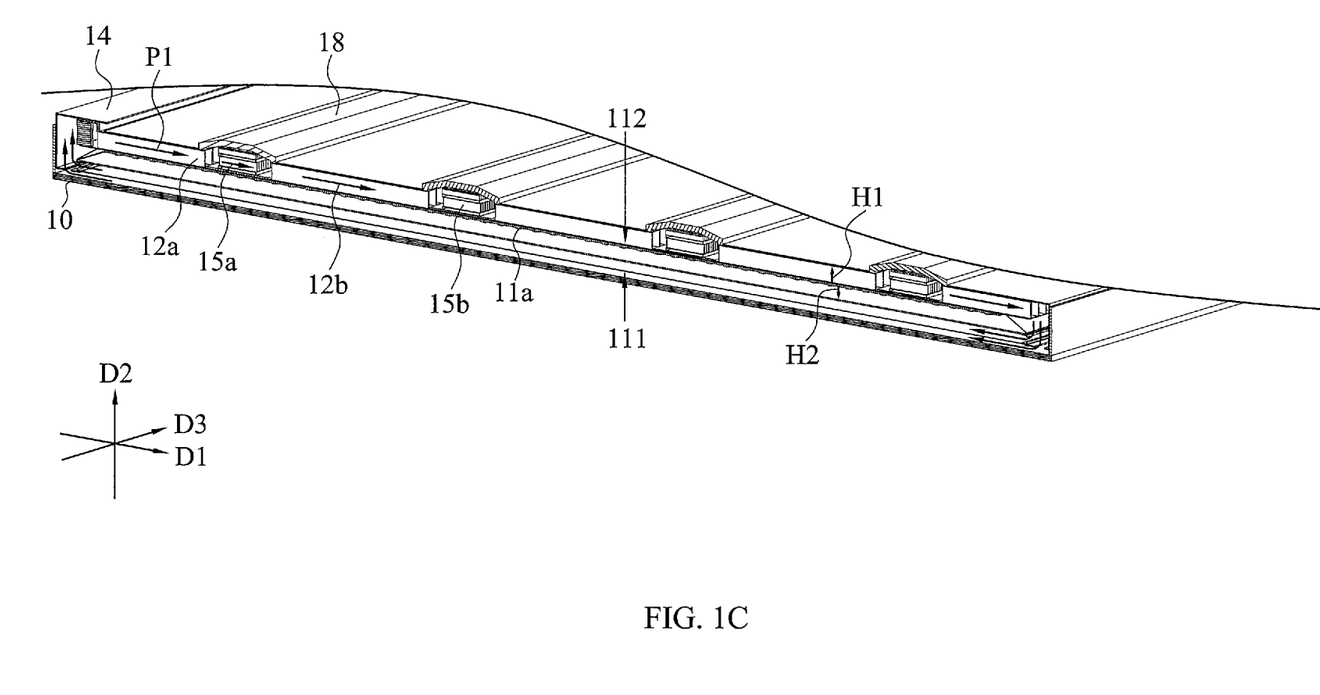
FIG. 1C is a sectional perspective view of the exemplary display in FIG. 1A, in accordance with an embodiment of the present disclosure.

FIG. 1C is a sectional perspective view of the exemplary display 1 in FIG. 1A, in accordance with an embodiment of the present disclosure.

As shown in FIG. 1C, the direction D1 may be substantially parallel to the rear surface 112 of the display module 11, the direction D2 may be substantially perpendicular to the rear surface 112 of the display module 11, and the direction D3 may be substantially perpendicular to the direction D1 and the direction D2.

The fluid guiding part 12a, the fluid guiding part 12b, the evaporator 15a, and the evaporator 15b are sequentially arranged along the direction D1. The fluid guiding part 12a, the fluid guiding part 12b, the evaporator 15a, and the evaporator 15b jointly define a fluid path P1. The air generated by the fan module 14 may be conducted through the fluid path P1 across the rear surface 112 of the display module 11 in the direction D1. For example, the air is generated from the fan module 14 on a side of the rear surface 112 of the display module 11 toward an opposite side of the rear surface 112 of the display module 11.

At the opposite side, the air turns to flow through the display module 11 and across the front surface 111 of the display module 11. For example, the air may circulate across the rear surface 112 and the front surface 111 of the display module 11.

For example, the air may pass through a space between a diffuser and a glass panel. For example, the air may pass through a space between the glass panel and the housing 10. In some embodiments, the heat H1 and the heat H2 generated from the pixels 11a may be dissipated or cooled by the air conducted in the fluid path P1. The arrows of the heat H1 and the heat H2 represent for opposite heat dissipation routes. For example, the heat H1 may be dissipated or cooled by the air across the rear surface 112. The heat H2 may be dissipated or cooled by the air across the front surface 111.

In a comparative embodiment, there is no evaporator on the rear surface 112. Therefore, the heat in the fluid path P1 would be dissipated in a lower rate. In some cases, when heat accumulates in the housing 10, the display module 11 may overheat and its performance may be degraded. In some other cases, the temperature difference between the outside and the inside of the housing 10 may cause dew condensation and affect the visibility of the displayed image.

In some embodiments, an object of the present disclosure is to improve the heat dissipation effectiveness of the display. For example, the evaporator 15a and the evaporator 15b are attached to the rear surface 112 of the display module 11 through the supporting plate 12c. The phase change material conducting through the evaporator 15a and the evaporator 15b can absorb heat without raising temperature. Therefore, the heat may be conducted to the evaporator 15a and the evaporator 15b from the rear surface 112 of the display module 11 through heat conduction without raising temperature.

Furthermore, the air passing through the rear surface 112 of the display module 11 may be dissipated or cooled when passing through the evaporator 15a and the evaporator 15b. Hence, temperature difference between the rear surface 112 and the front surface 111 of the display module 11 may be reduced or neutralized. The heat dissipation of the display 1 of the present disclosure may be more efficient in comparison with the comparative embodiment, and overheating and dew condensation may be avoided. In addition, the display 1 of the present disclosure may be lighter and more compact in comparison with the comparative embodiment.

It is comtemplated that the supporting structure, including the fluid guiding parts 12a, 12b and the supporting plate 12c, provides not only mechanical strength for supporting the display module 11 but also thermal conduction for heat dissipation. The structure of the display 1 is shriked and elaborate.

Figure 2A:
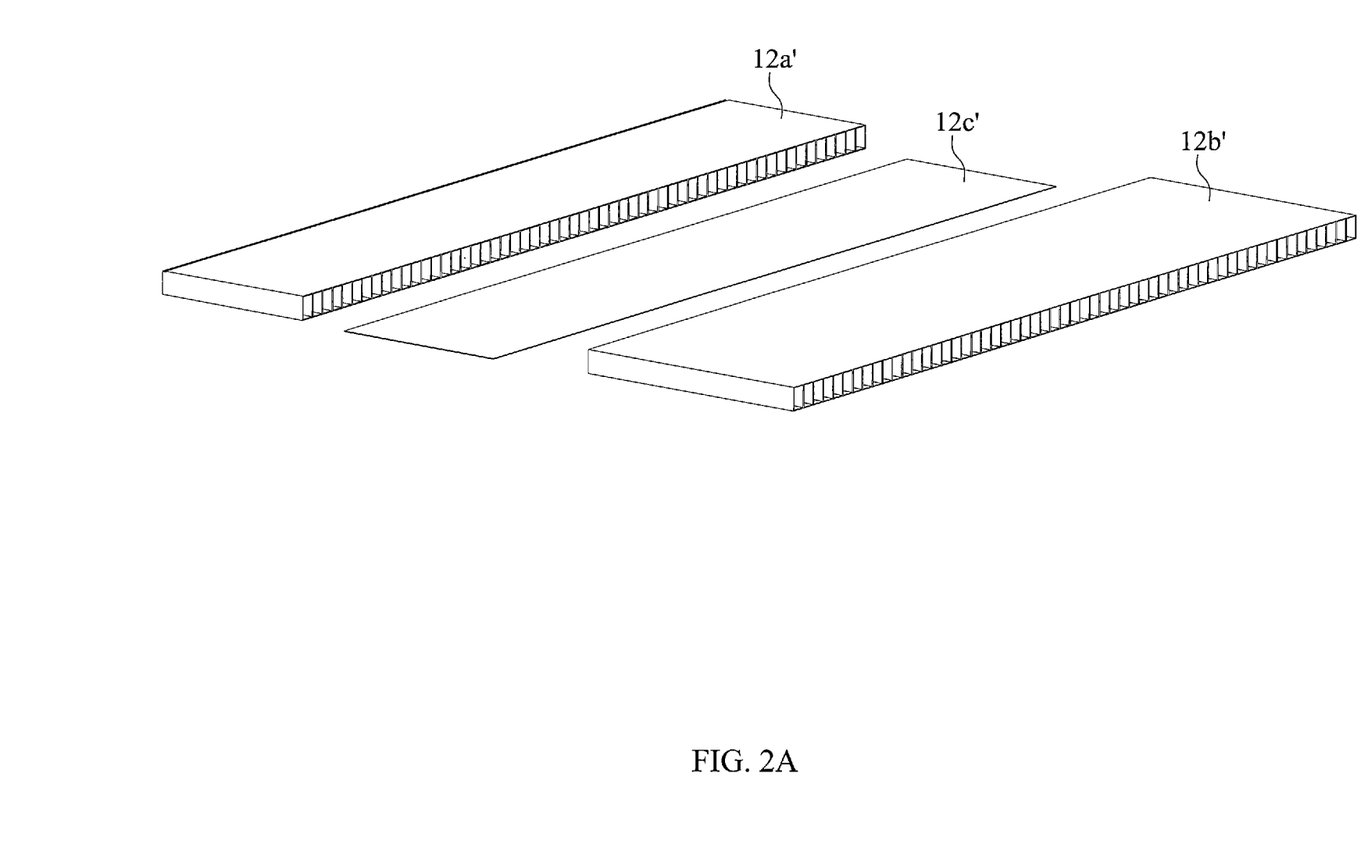
FIG. 2A is an exploded view of an exemplary supporting structure, in accordance with an embodiment of the present disclosure.
Figure 2B:
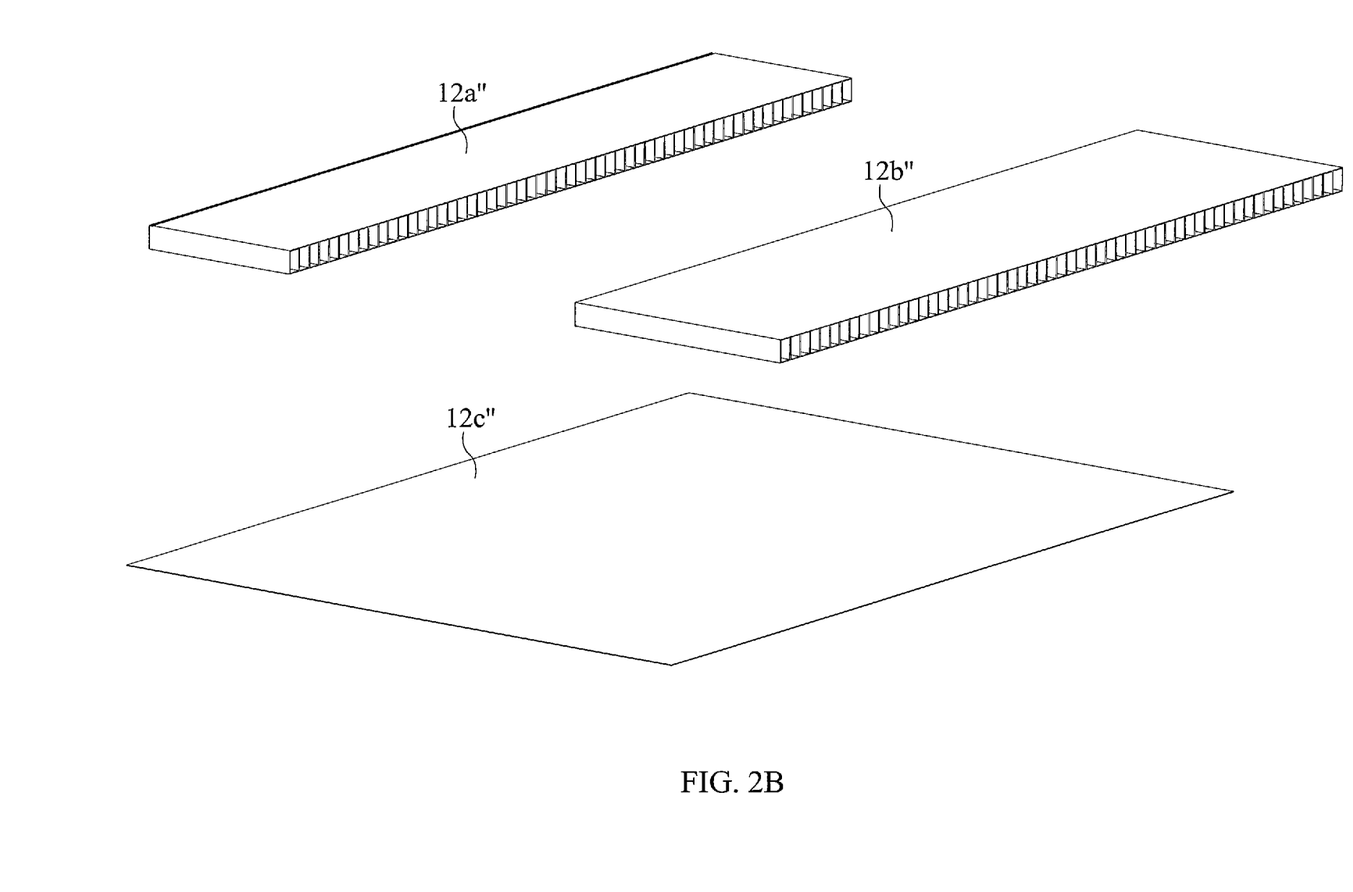
FIG. 2B is an exploded view of an exemplary supporting structure, in accordance with an embodiment of the present disclosure.

FIG. 2A and FIG. 2B are exploded views of exemplary supporting structures, in accordance with an embodiment of the present disclosure. Each of the supporting structures in FIG. 2A and FIG. 2B is similar to the supporting structure 12 in FIG. 1B except for the differences described below.

In FIG. 2A, the fluid guiding parts 12a' and 12b' are attached to opposite sides of the supporting plate 12c'. For example, the fluid guiding parts 12a' and 12b' and the supporting plate 12c' are discrete elements. The fluid guiding parts 12a' and 12W may be fixed to opposite sides of the supporting plate 12c'. The supporting plate 12c' may between the fluid guiding parts 12a' and 12W. An evaporator may be disposed on the supporting plate 12c' and between the fluid guiding parts 12a' and 12b'. The number of the fluid guiding parts 12a' and 12W and the number the supporting plates may be determined based on the size of the display module 11 or other design requirements and are not limited to this embodiment.

In FIG. 2B, the fluid guiding parts 12a" and 12W' are on the same side of the supporting plate 12c". The supporting plate 12c" may have the same size as the rear surface 112 of the display module 11. However, the dimension or the shape of the supporting plate 12c" may be adjusted based on the design requirements and is not limited thereto.

In some embodiments, the supporting structure 12 in FIG. 1B may be replaced with the supporting structures in FIG. 2A and FIG. 2B. In some embodiments, the fluid guiding parts and the supporting plate may be combined by a connector or an adhesive. In some embodiments, the supporting structure 12 in FIG. 1B may formed in one piece. For example, the supporting structure 12 may include a plurality components welded together.

Figure 3A:
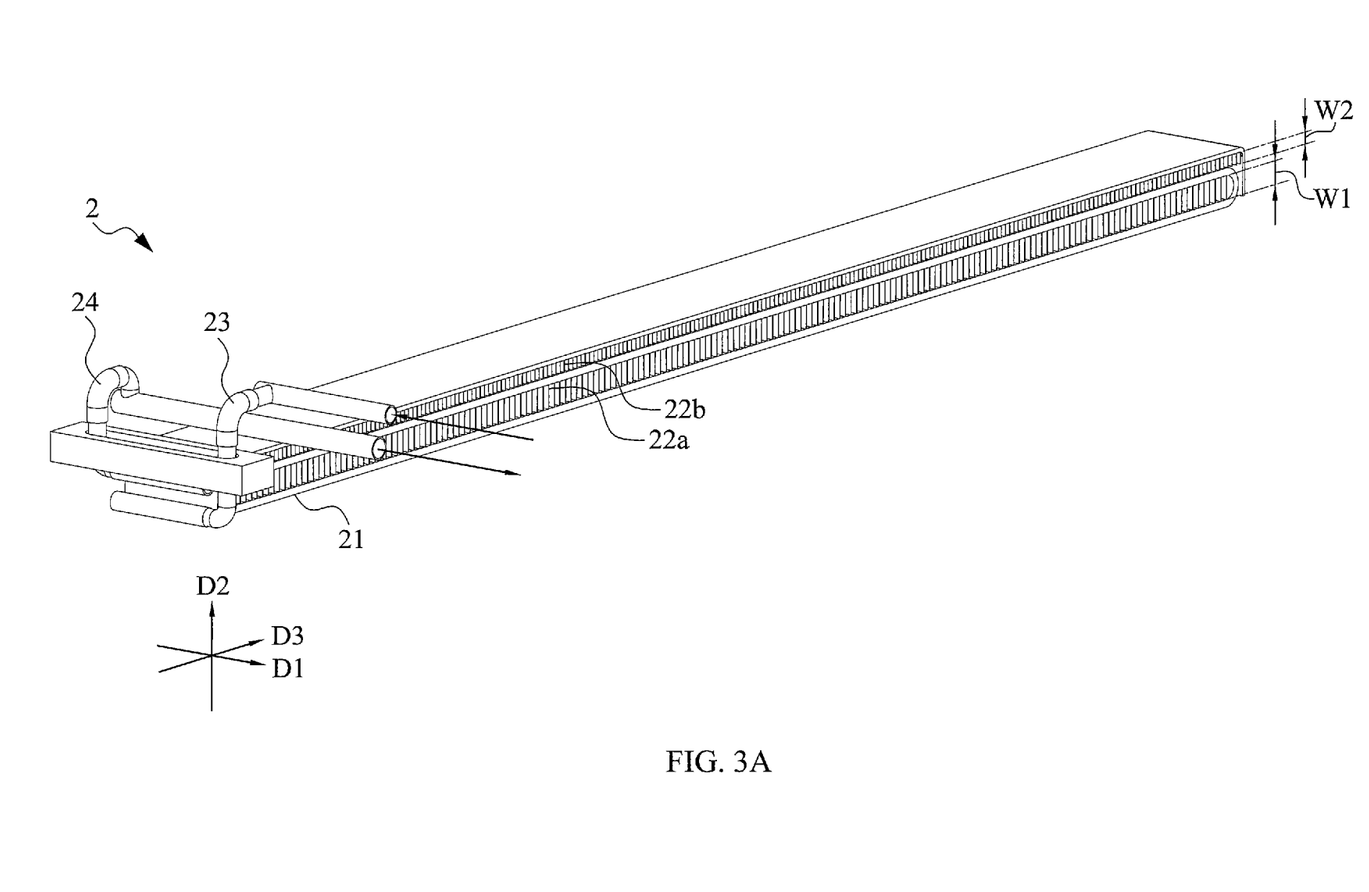
FIG. 3A is a perspective view of an exemplary evaporator, in accordance with an embodiment of the present disclosure.
Figure 3B:
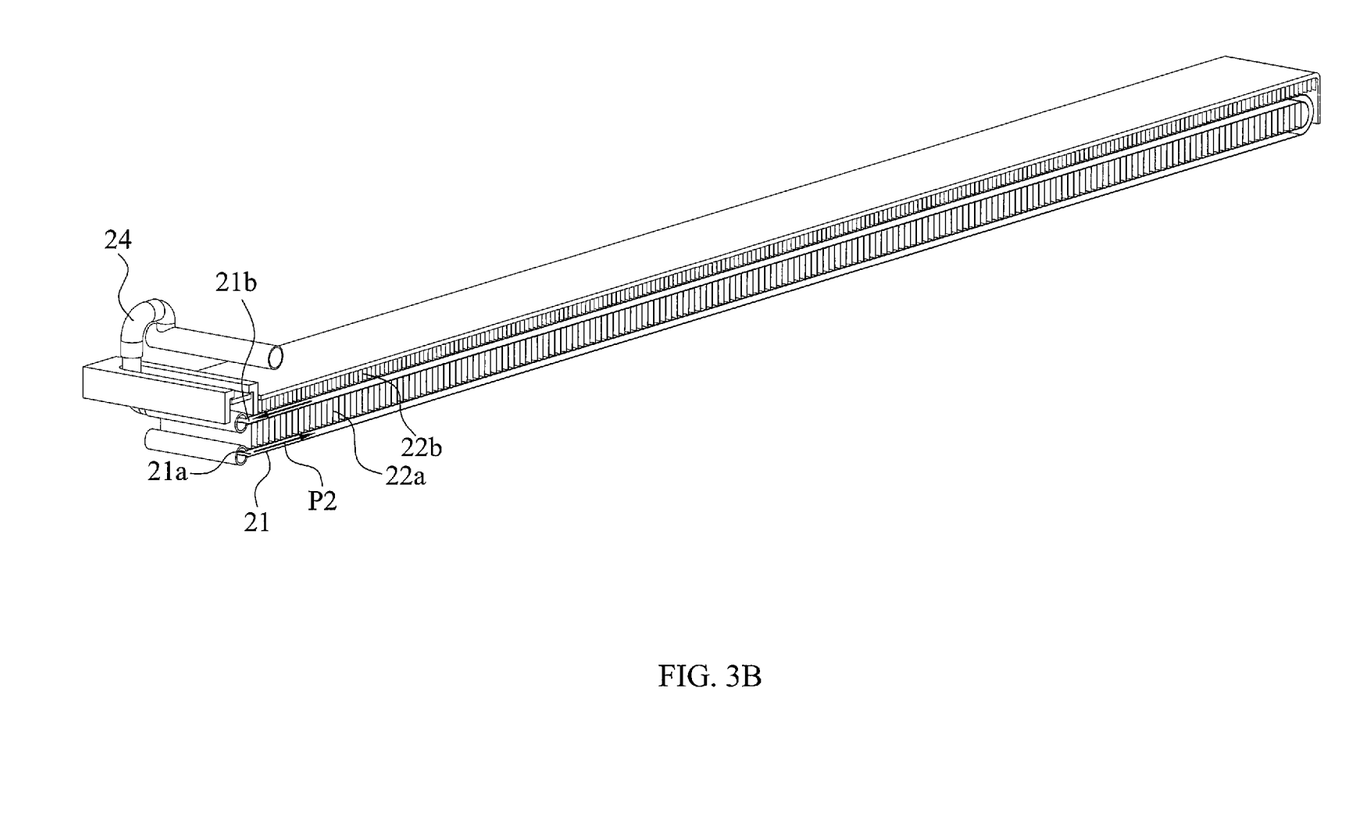
FIG. 3B is a sectional perspective view of the exemplary evaporator in FIG. 3A, in accordance with an embodiment of the present disclosure.

FIG. 3A is a perspective view of an exemplary evaporator 2, in accordance with an embodiment of the present disclosure. FIG. 3B is a sectional perspective view of the exemplary evaporator 2 in FIG. 3A, in accordance with an embodiment of the present disclosure. In some embodiments, the evaporator 2 in FIG. 3A may be the same as the evaporator 15 in FIG. 1.

The evaporator 2 may include a U-shaped flat tube 21, and groups of channels 22a and 22b. The tubes 23 and 24 may be in fluid communication with the U-shaped flat tube 21 of the evaporator 2. In some embodiments, each of the tubes 23 and 24 may be the same as the tubes 16 and 17 in FIG. 1B.

The U-shaped flat tube 21 may have a lower part and an upper part connected to the lower part. The lower part may have an inlet (such as the inlet 21a in FIG. 3B) and extends in the direction D3. The lower part may turns and connects with the upper part. The upper part may have an outlet (such as the outlet 21b in FIG. 3B) and extends in a reverse direction (with respect to the lower part) such that the inlet and the outlet may be on the same side of the U-shaped flat tube 21.

The group of channels 22a may be partially surrounded by the U-shaped flat tube 21. For example, the group of channels 22a may be disposed between the lower part and the upper part of the U-shaped flat tube 21. The group of channels 22b may be on the upper part of the U-shaped flat tube 21. Each of the group of channels 22a and the group of channels 22b may extend in the direction D1. Each of the group of channels 22a and the group of channels 22b may open toward the direction D1.

A dimension W1 (such as a height or a width measured in the direction D2) of the group of channels 22a may be different from a dimension W2 (such as a height or a width measured in the direction D2) of the group of channels 22b. For example, the dimension W1 may be greater than the dimension W2. For example, the dimension W1 may be less than the dimension W2. In some embodiments, the dimension W1 may be the same as the dimension W2.

In some embodiments, the group of channels 22a, the group of channels 22b, and the channels of the fluid guiding part as illustrated in FIG. 1B may have the same dimension (e.g., the width, the height, and/or the length). In some embodiments, the group of channels 22a, the group of channels 22b, and the channels of the fluid guiding part as illustrated in FIG. 1B may have a different dimension.

A phase change material may be conducted into the U-shaped flat tube 21 through the tube 23 and out of the U-shaped flat tube 21 through the tube 24. As shown in FIG. 3B, the phase change material may flow into the U-shaped flat tube 21 through the inlet 21a in the fluid path P2 and flow out of the U-shaped flat tube 21 through the outlet 21b. In some embodiments, the fluid path P2 may be isolated from the fluid path P1.

Since each of the group of channels 22a and the group of channels 22b may be in fluid communication with the fluid guiding parts of the supporting structure (such as the supporting structure 12 in FIG. 1B), the air passing through the fluid guiding parts of the supporting structure may be dissipated or cooled by the phase change material when passing through the group of channels 22a and the group of channels 22b.

Figure 4A:
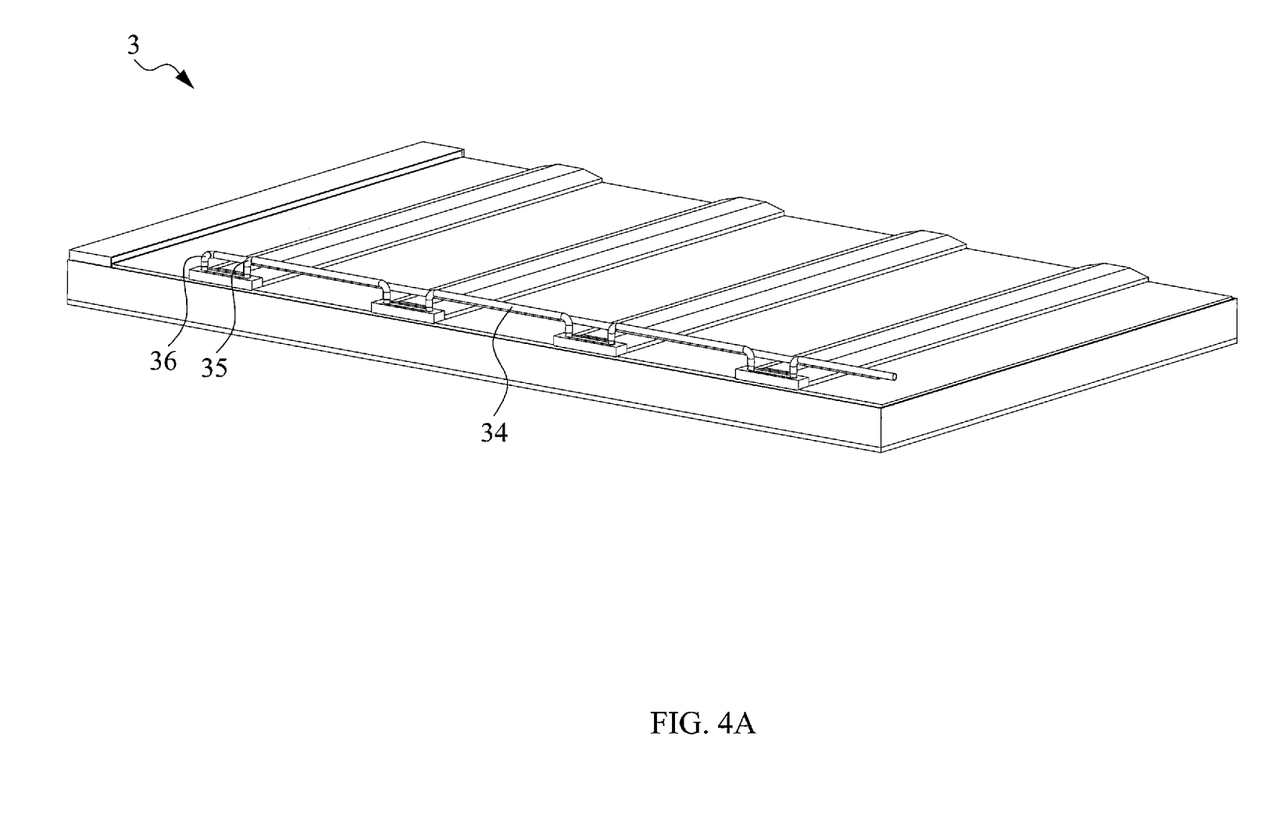
FIG. 4A is a perspective view of an exemplary display, in accordance with an embodiment of the present disclosure.
Figure 4B:
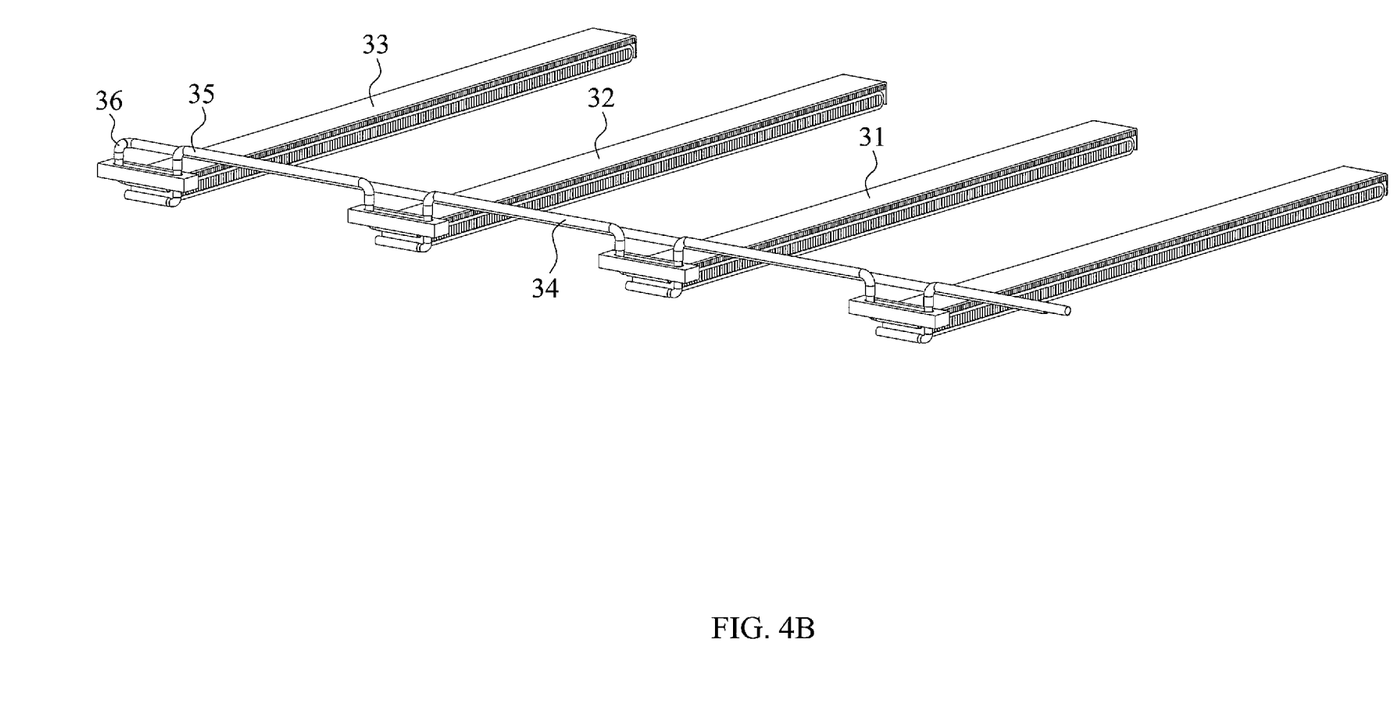
FIG. 4B is a perspective view of exemplary evaporators of the exemplary display in FIG. 4A, in accordance with an embodiment of the present disclosure.

FIG. 4A is a perspective view of an exemplary display 3, in accordance with an embodiment of the present disclosure. FIG. 4B is a perspective view of exemplary evaporators of the exemplary display 3 in FIG. 4A, in accordance with an embodiment of the present disclosure. The display 3 is similar to the display 1 in FIG. 1A except for the differences described below.

In display 3, the outlet of the evaporator 31 is in fluid communication with the inlet of the evaporator 32 through the tube 34, and the outlet of the evaporator 31 is in fluid communication with the inlet of the evaporator 33 through the tube 35. The outlet of the evaporator 33 is in fluid communication with a source (not illustrated in the figures) of a phase change material, a refrigerated air, a coolant agent, or a freezing mixture.

In display 1, the tube 16 is in fluid communication with the inlet of the evaporator 15 and the tube 17 is in fluid communication with the outlet of the evaporator 15.

In some embodiments, the display 3 may further reduce the temperature difference in comparison with display 1, and the flow resistance of the display 1 may be less than the display 3.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A display, comprising:
   a display module having a front surface and a rear surface opposite the front surface of the display module;
   a supporting plate attached to the rear surface of the display module;
   an evaporator attached to the supporting plate and thermally connected to the rear surface of the display module through the supporting plate;
   a first fluid-guiding part; and
   a second fluid-guiding part spaced apart from the first fluid-guiding part, wherein the evaporator are disposed between the first fluid-guiding part and the second fluid-guiding part.

2. The display of claim 1, wherein the rear surface of the display module includes a rear surface of an LED-backlight.

3. The display of claim 1, wherein the supporting plate, the first fluid-guiding part and the second fluid-guiding part are formed in one piece.

4. The display of claim 1, wherein the first fluid-guiding part is attached to a first side of the supporting plate and the second fluid-guiding part is attached to a second side of the supporting plate opposite to the first side.

5. The display of claim 1, wherein the supporting plate is sized as per the display module, and the first fluid-guiding part and the second fluid-guiding part are disposed on the supporting plate.

6. The display of claim 1, wherein the first fluid-guiding part the second fluid-guiding part and the evaporator jointly define a part of a fluid path extending across the rear surface of the display module.

7. The display of claim 6, wherein the fluid path further extends to across the front surface of the display module.

8. The display of claim 6, wherein the fluid path further extends through the display module.

9. The display of claim 6, wherein the first fluid-guiding part, the evaporator, and the second fluid-guiding part are sequentially arranged along a first direction, and the fluid path extends along the first direction.

10. The display of claim 1, wherein the evaporator includes a U-shaped flat tube having an inlet and an outlet arranged on the same side of the evaporator.

11. The display of claim 10, wherein the evaporator includes a first group of channels and a second group of channels, each of the first group of channels and the second group of channels extending in the same direction.

12. The display of claim 11, wherein the first group of channels is partially surrounded by, and thermally connected to, the U-shaped flat tube.

13. The display of claim 11, wherein the second group of channels is attached to, and thermally connected to, a portion of the U-shaped flat tube.

14. The display of claim 11, wherein a dimension of the first group of channels measured in a second direction is different from a dimension of the second group of channels measured in the second direction.

15. The display of claim 11, wherein at least one of the first group of channels and the second group of channels is in fluid communication with the first fluid-guiding part and the second fluid-guiding part.

16. The display of claim 11, wherein the U-shaped flat tube is configured to conduct a phase change material, thereby dissipating the heat from the fluid in the first group of channels and second group of channels.

17. A display for a display, comprising:
    a display module having a front surface and a rear surface opposite the front surface of the display module;
    a one-piece supporting structure including a first fluid-guiding part and a plate portion, the one-piece supporting structure is disposed on the rear surface of the display module; and
    a first evaporator disposed on the plate portion and next to the first fluid-guiding part,
    wherein the first fluid-guiding part is in fluid communication with the first evaporator.

18. The display of claim 17, further comprises a second evaporator disposed on the plate portion and between the first fluid-guiding part and a second fluid-guiding part on the rear surface of the display module.

19. The display of claim 18, wherein a first channel defined by the first fluid-guiding part and a second channel defined by the second fluid-guiding part are in fluid communication through a third channel defined by the second evaporator.

20. The display of claim 17, further comprising:
a tube in fluid communication with an inlet of the first evaporator and an inlet of the second evaporator.

21. The display of claim 17, further comprising:
a tube in fluid communication with an inlet of the first evaporator and an outlet of the second evaporator.

22. A display for a display, comprising:
a display module having a front surface and a rear surface opposite the front surface of the display module;
a fluid-guiding part disposed on and thermally connected to the rear surface of the display module, wherein the fluid-guiding part defines a part of a first fluid path extending across the rear surface of the display module; and
an evaporator disposed on the rear surface of the display module and next to the fluid-guiding part, wherein the evaporator defines a second fluid path, isolated from the first fluid path, for conducting a phase change material.

23. The display of claim 22, wherein the first fluid path is configured to dissipating heat by circulating an air flow within the display.

24. The display of claim 22, wherein the first fluid path extends in a first direction and the second fluid path extends in a second direction substantially perpendicular to the first direction.

25. The display of claim 22, wherein the phase change material includes a saturation temperature between about 30° C. and about 50° C.

* * * * *